US009589496B2

(12) United States Patent
Lu (10) Patent No.: US 9,589,496 B2
(45) Date of Patent: Mar. 7, 2017

(54) TEMPORAL DITHERING TECHNIQUE USED IN ACCUMULATIVE DATA COMPRESSION (71) Applicant: SAMSUNG DISPLAY CO., LTD., Yongin, Gyeonggi-Do (KR)

(72) Inventor: Ning Lu, Saratoga, CA (US)

(73) Assignee: Samsung Display Co., Ltd., Yongin-si (KR)

(*) Notice: Subject to any disclaimer, the term of this patent is extended or adjusted under 35 U.S.C. 154(b) by 390 days.

(21) Appl. No.: 14/450,171

(22) Filed: Aug. 1, 2014

(65) Prior Publication Data
US 2015/0062202 A1 Mar. 5, 2015

Related U.S. Application Data (60) Provisional application No. 61/870,743, filed on Aug. 27, 2013.

(51) Int. Cl.
G06F 1/00 (2006.01)
G09G 3/20 (2006.01)
H03M 7/30 (2006.01)
G06F 11/30 (2006.01)
G09G 3/32 (2016.01)

(52) U.S. Cl.
CPC ....... *G09G 3/2044* (2013.01); *G06F 11/3003* (2013.01); *G09G 3/3208* (2013.01); *H03M 7/3059* (2013.01); *G09G 2320/029* (2013.01); *G09G 2320/046* (2013.01); *G09G 2340/0428* (2013.01)

(58) Field of Classification Search
CPC .. G09G 3/20; G09G 3/32; G09G 5/36; G09G 3/3208; G09G 2320/046; G06F 7/38; G06F 11/30
See application file for complete search history.

(56) References Cited

U.S. PATENT DOCUMENTS

2003/0172100 A1* 9/2003 Tessarolo .............. G06F 7/5095
708/513
2013/0063458 A1* 3/2013 Shido ...................... G09G 5/24
345/545

FOREIGN PATENT DOCUMENTS

JP 2009-296368 A 12/2009
JP 2010-136417 A 6/2010
KR 10-2006-0065263 A 6/2006
KR 10-2013-0077044 A 7/2013
(Continued)

OTHER PUBLICATIONS

Extended European Search Report dated Oct. 23, 2014 for European Patent Application No. EP 14182548.9, 5 pages.

*Primary Examiner* — Michael Faragalla
(74) *Attorney, Agent, or Firm* — Lewis Roca Rothgerber Christie LLP (57) ABSTRACT A method of accumulating data by a processor in a non-volatile memory to track use of a device. The method includes: retrieving by the processor a next datum for accumulation into a first accumulation stored in the memory, the next datum representing a next use of the device; generating by the processor a next dither offset; adding by the processor the next dither offset to the next datum to produce a first sum; dividing by the processor the first sum by a scale factor to produce a quantized datum; and adding by the processor the quantized datum to the first accumulation. The first accumulation tracks the use of the device.

20 Claims, 4 Drawing Sheets (56) References Cited

FOREIGN PATENT DOCUMENTS

KR 10-2013-0097687 A 9/2013

* cited by examiner

TEMPORAL DITHERING TECHNIQUE USED IN ACCUMULATIVE DATA COMPRESSION

CROSS-REFERENCE TO RELATED APPLICATION(S)

This application claims priority to and the benefit of U.S. Provisional Application No. 61/870,743, filed on Aug. 27, 2013, the entire content of which is herein incorporated by reference.

BACKGROUND

1. Field

Aspects of embodiments of the present invention are directed to a temporal dithering technique used in accumulative data compression.

2. Description of Related Art

Accumulative data, such as numerical data accumulated (e.g., summed) over time has many applications, such as tracking pixel stress in display devices. When the size of the accumulation or the number of the accumulations exceeds the available memory or storage, decisions must be made on how to handle the overflow. Usually such decisions involve a tradeoff of accuracy of the accumulated data versus accumulating less of the data. Assuming accumulating less of the data (to preserve accuracy of that which is accumulated) is not an acceptable option, then preserving as much accuracy as possible with the (overflowing) accumulated data is important.

In many display panel technologies, such as televisions, computer monitors, and other (potentially) large panel display applications, the display panels (and more specifically, their individual pixels) may be driven with bright light output levels and have a long product lifecycle. Without luminance and color stress data compensation, visible differential aging may cause image burn-in (also referred to as image sticking) where the viewer sees historical images that are no longer present in the current image content. While the human eye is not very sensitive toward absolute luminance levels, the human eye is very sensitive to relative luminance differences in a display panel (e.g., even a 10% difference in luminance of the same intended brightness between adjacent areas may be easily detected). To eliminate image sticking, luminance or color stress data compensation may be applied as a countermeasure to aging both for localized areas as well as over the entire screen.

For example, organic light emitting diode (OLED) technology has been applied to television and other large-sized display device applications. In these applications, display panel longevity is potentially an issue. This issue may be exacerbated with increased resolutions that drive current densities to ever-higher values. For example, with brighter screens, usages with fixed data content, or higher resolution screens, screen aging and color compensation technology may become necessary to satisfy user expectations. This may require the storage of a large amount of accumulative data in a fixed amount of storage.

SUMMARY

Aspects of embodiments of the present invention are directed toward a temporal dithering technique used in accumulative data compression. By using dithering, embodiments of the present invention achieve better accuracy of space-constrained accumulations than is possible with comparable techniques. Further embodiments of this technique are directed to display devices, which may use the accumulative data compression to track the accumulative stress on each pixel or group of pixels. This accumulated stress data may be applied, for example, to color correction and compensation algorithms in display devices that adjust image data (possibly on a pixel-by-pixel basis) used to drive the display device to account for use and degradation of the different pixels in the display device.

Embodiments of the present invention provide for an innovative temporal dithering technique for collecting accumulative data and storing that data in compressed memory. Further embodiments of the present invention provide for a display device, system, and method of accumulating and storing organic light emitting diode (OLED) display color stress data on a pixel-by-pixel basis. Further embodiments are directed to accumulating usage data of a device and its components. Still further embodiments are directed to accumulating statistical data over time in limited storage for later retrieval and use.

In an embodiment of the present invention, a method of accumulating data by a processor in a nonvolatile memory to track use of a device is provided. The method includes: retrieving by the processor a next datum for accumulation into a first accumulation stored in the memory, the next datum representing a next use of the device; generating by the processor a next dither offset; adding by the processor the next dither offset to the next datum to produce a first sum; dividing by the processor the first sum by a scale factor to produce a quantized datum; and adding by the processor the quantized datum to the first accumulation. The first accumulation tracks the use of the device.

The generating of the next dither offset may include adding a dither increment to a previous dither offset.

The dither increment may be relatively prime to the scale factor.

The dither increment may be between two-thirds and three-fourths of the scale factor.

The scale factor may be a power of two.

The method may further include increasing the scale factor over time.

The increasing of the scale factor may include decreasing the first accumulation by a corresponding ratio.

In another embodiment of the present invention, a system for accumulating data to track use of a device is provided. The system includes a nonvolatile memory for storing the accumulated data, and a processor. The processor is configured to: retrieve a next datum for accumulation into a first accumulation stored in the memory, the next datum representing a next use of the device; generate a next dither offset; add the next dither offset to the next datum to produce a first sum; divide the first sum by a scale factor to produce a quantized datum; and add the quantized datum to the first accumulation. The first accumulation tracks the use of the device.

The processor may be further configured to generate the next dither offset by adding a dither increment to a previous dither offset.

The dither increment may be relatively prime to the scale factor.

The dither increment may be between two-thirds and three-fourths of the scale factor.

The scale factor may be a power of two.

The processor may be further configured to increase the scale factor over time.

The increasing of the scale factor over time may include decreasing the first accumulation by a corresponding ratio.

In yet another embodiment of the present invention, a display device is provided. The display device includes: pixels for displaying an image using corresponding image data; a nonvolatile memory for storing accumulated stress data, the stress data corresponding to the image data; and a processor. The processor is configured to retrieve a next stress datum of the stress data to accumulate into a first accumulation stored in the memory, generate a next dither offset, add the next dither offset to the next stress datum to produce a first sum, divide the first sum by a scale factor to produce a quantized datum, and add the quantized datum to the first accumulation. The first accumulation tracks a use of one or more corresponding ones of the pixels.

The processor may be further configured to generate the next dither offset by adding a dither increment to a previous dither offset.

The dither increment may be relatively prime to the scale factor.

The dither increment may be between two-thirds and three-fourths of the scale factor.

The scale factor may be a power of two.

The processor may be further configured to increase the scale factor over time.

BRIEF DESCRIPTION OF THE DRAWINGS

The patent application file contains at least one drawing executed in color. Copies of this patent or patent application publication with color drawing(s) will be provided by the Office upon request and payment of the necessary fee.

The accompanying drawings, together with the specification, illustrate example embodiments of the present invention. These drawings, together with the description, serve to better explain aspects and principles of the present invention.

DETAILED DESCRIPTION

Example embodiments of the present invention will now be described with reference to the accompanying drawings. In the drawings, the same or similar reference numerals refer to the same or similar elements throughout. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

In one or more embodiments of the present invention, a temporal dithering technique for collecting accumulative data and storing that data in compressed memory is provided. The accumulative data may be, e.g., usage data of a device or of a component of the device. As a non-limiting embodiment, the accumulative data will be described as stress data for individual pixels of a display device, where the stress data represents the wear and tear on a pixel when displaying a particular brightness (as occurs on OLED display devices). In this case, there may be a separate accumulation for every pixel in the display device, in order to track this stress over time for each pixel.

Let N denote the number of different accumulations performed concurrently over time. For ease of description, it will be assumed that the accumulations are of fixed-point unsigned quantities (e.g., whole numbers), though the present invention is not limited thereto, and the extension to other types of numbers (such as floating point or signed) would be apparent to one of ordinary skill. If there is sufficient storage (memory) for M bits for each of the N accumulations (i.e., N×M total bits of memory), then each of the accumulations preserves accuracy only as far as it does not exceed M bits of significance.

By way of example, each of the accumulations may track the total accumulated image data (or corresponding stress data) for a particular pixel of an organic light emitting diode (OLED) display device. This data may be useful, for example, in the development and implementation of algorithms for color compensation and correction after collection and storage of accumulated OLED display color stress data. As an example, if there are 768×1024=786,432 separate pixels to track in the OLED display device, and each pixel is driven by an image datum of 8 bits (e.g., stress values from 0 to 255) for each of 120 frames per second, then one hour of such accumulations would require N=786,432 accumulators capable of holding fixed point sums as large as 255 (maximum stress value)×120 (frames/second)×3600 (seconds/hour)=110,160,000 (i.e., M=27 bits of precision), for a total storage of N×M=21,233,664 bits.

Accumulating data, for example, for more pixels, or more frequently per second, or with more precision in the image data, or for a longer period, etc., increases the corresponding storage amount proportionally, if accuracy is to be preserved. At some point, this may no longer be practical, in which case M may need to be capped at a fixed number of bits per pixel. Embodiments of the present invention are directed toward making efficient use of those M bits.

Figure 1:
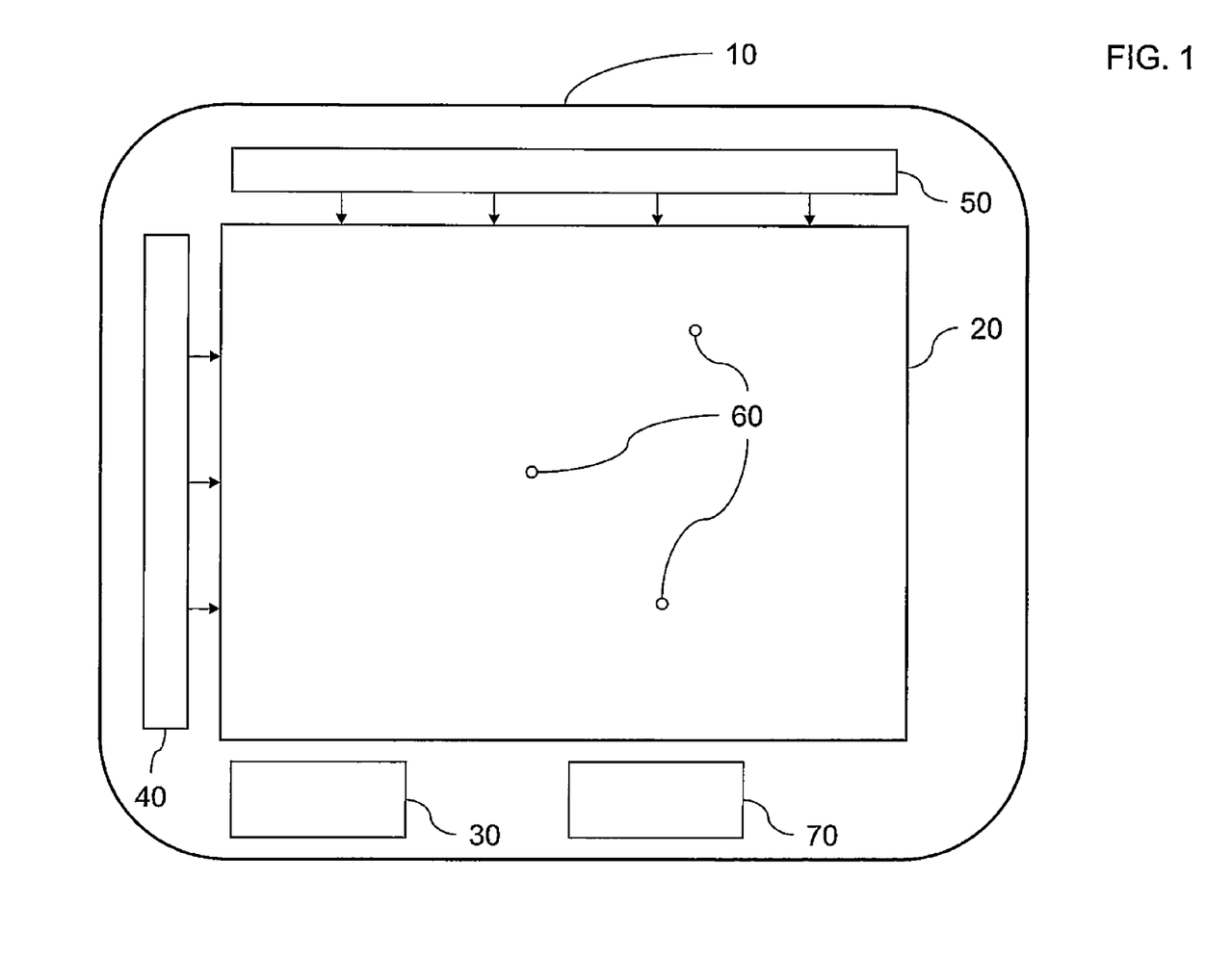
FIG. 1 is a schematic diagram of an example display device according to an embodiment of the present invention.

FIG. 1 is a schematic diagram of an example display device 10 according to an embodiment of the present invention.

The display device 10 includes a display panel 20 and a controller 30. The display device 10 may further include a scan driver 40 and a data driver 50 for driving pixels 60 (for example, pixels 60 at crossing regions of horizontal scan lines emanating from the scan driver 40 and vertical data lines emanating from the data driver 50). The display panel 20 may be a flat panel display panel, such as an OLED display panel, for displaying images (for example, color images using red, green, and blue pixels 60 configured to respectively emit red, green, and blue light) to a user or viewer of the display panel. For example, there may be 768 scan lines and 1024 data lines, with 786,432 corresponding pixels 60 at crossing regions of the scan lines and data lines. For ease of description, the display panel 20 will be described herein as an OLED display panel.

While the present specification refers to red, green, and blue pixels, the present invention is not limited thereto. In other embodiments, for example, the pixels 60 may correspond to other colors, and there may be more or fewer colors of pixels than three, as would be apparent to one of ordinary skill.

The controller 30 controls operations of the display device 10, such as the pixels 60 of the display panel 20. The controller 30 may control the pixels 60, for example, by controlling the scan driver 40 and the data driver 50 (e.g., by receiving image signals from an outside source, converting them to corresponding data signals to drive the pixels 60, and supplying the data signals to the data driver 50). The controller 30 may also accumulate stress data (such as color stress data) for each of the pixels 60 (and their corresponding OLEDs), the stress data corresponding to the data signals (e.g., gray level or brightness level). To this end, the controller may be provided with a memory 70 (such as a solid-state memory or flash memory) for holding individual stress data accumulations for each of the pixels 60. While the controller 30 is illustrated in FIG. 1 as one component, it may also be implemented as multiple components or microprocessors (for example, one for controlling image generation, one for performing color stress data accumulation corresponding to the data signals) as would be apparent to one of ordinary skill.

The pixels 60 of the display panel may be controlled by the scan driver 40 and the data driver 50. For example, the data driver 50 may transmit data signals to columns (such as columns of pixels 60) of the display panel 20 in synchronization with scan signals transmitted by the scan driver 40 to rows (such as rows of pixels 60) of the display panel 20, as would be apparent to one of ordinary skill in the art. For instance, the scan driver 40 may transmit the scan signals to the rows of pixels 60 by corresponding scan lines while the data driver 50 may transmit the data signals to the columns of pixels 60 by corresponding data lines.

While some embodiments of the present invention are directed to accumulating OLED display device stress data over time on a pixel-by-pixel basis, the present invention is not limited thereto. Other embodiments may be directed to other display devices (such as liquid crystal displays), or to different data accumulations on a display device, or to accumulations corresponding to different groups (e.g., groups of pixels, or one or more other repeated circuits in a display device), or to other electronic devices. Further embodiments may be applied to any usage where accumulative statistical data needs to be collected and saved into memory for later usage. However, for ease of description, described embodiments will be directed to the accumulation of OLED stress data (as whole numbers) on a pixel-by-pixel basis, with extensions to other similar data accumulation situations being apparent to one of ordinary skill.

A data sequence is said to be nearly continuous if consecutive data statistically tend to have similar values. For example, co-located display pixel data often changes gradually or not at all for long periods of time (e.g., relative to driving frequency), in which case the differences of consecutive pixel values form a Gaussian distribution near 0. One or more embodiments of the present invention may be especially applicable in situations where the collected data has this nearly continuous property.

As a general framework, consider a sequence of (sample) data values obtained over time: $D_1, D_2, \ldots, D_K, \ldots$. A useful statistic of such data values is the sum (or, equivalently, the average value). Since the maximum value of K may be in the billions or more of sample values, it may not be practical for the sum or average to be computed or maintained with absolute precision, particularly if many (even millions) of such sequences are being tracked. Accordingly, a more practical goal may be to maintain an accurate approximation for the updated accumulative sum or average at any moment K. However, as the number of samples K continues to grow (perhaps in the billions or more), the effect of each new sample on the accumulative sum or average may become so small as to not affect (or disproportionally affect) the accumulation, which may introduce (potentially significant) error in the process. Consequently, in order to maintain the accuracy of such a sum or average without this error drifting effect, the actual error in the sum or average should be controlled.

Depending on the size K of the data sequence (which may range in the millions to billions or more), 25-35 extra bits (or more) may be needed just to maintain absolute precision in the resulting sum. For example, assume a television screen has an image or stress data depth of D bits per frame and a requirement to accumulate $K=2^A$ such image data or stress data over time. Even if only one datum is collected per second (and the television is driven at frame rates of 60 to 120 frames per second or more), then one year represents about 30 million seconds ($365 \times 24 \times 60 \times 60 = 31,536,000$), which is about $2^{25}$, therefore would require an extra 25 bits of storage. Assuming the television product lifetime of 8 years (3 additional bits), there would need to be at least A=28 extra bits (=25+3) for each datum to store the accumulation. Therefore, to store accumulative 8-bit data (D=8), then 36 (=28+8)-bit storage would be required if no compression is involved.

In general, if the data is in D bits, (D=8 in the above example), and A is the counting bits needed for accumulation (such as A=28 in the above example), then D+A bits will be needed for lossless storage of the accumulative stress data. However, such a large memory would be a burdensome requirement if, for example, such an accumulation was maintained for every pixel in the television. More frequent sampling (such as 10 samples per second), or accumulating every image value would further exacerbate this storage requirement.

The methodology may be considered when there are not enough memory bits to store lossless accumulative stress data. If, for example, if there are only 20 bits instead of 36 bits to store each accumulation in the above example, a determination must be made as to what data is stored or accumulated. For example, comparable techniques to those described herein may address this storage shortfall by lowering the bit accuracy (of the accumulated data), or lowering the sample rate, or doing a combination of both.

Using the above example, the data may be truncated to only store the top 4 bits of incoming data (i.e., standard quantization of the data, in this case dividing each data by 16 and truncating the result), which saves 4 bits per sample, and to accumulate only one out of every 4096 consecutive data (e.g., once every $2^{12}=4096$ seconds) to reduce an additional 12 bits. However, this loses the significance of the low order bits of data, which may add up over time (for instance, data values of 15 are reduced to 0). In addition, with these space-saving measures, instead of sampling one data per second, data would be sampled about once per hour. However, a single sample taken once per hour likely would not accurately capture screen content, potentially missing significant stress data events (for example, a fixed logo on a television show lasting 30 minutes might miss the sampling window). Further, as such problems only intensify with higher display rates and data sizes, the weaknesses of these comparable techniques become more apparent.

According to one or more embodiments of the present invention, carefully chosen temporal dithering offsets (e.g., pseudorandom noise) are applied to each datum (e.g., stress data) before quantization (e.g., division) and subsequent accumulation (e.g., addition). Briefly, stress data (e.g., whole numbers between 0 and 255, or 8 bits) are accumulated in stress data accumulations of M (memory) bits. In one or more embodiments, when sufficient data has been accumulated that M bits no longer holds the corresponding accumulations, the accumulations may be divided (e.g., scaled) by a scale factor S (such as a power of two) to allow further accumulations to proceed, albeit with less precision (accuracy), accumulations now representing multiples of S and not arbitrary whole numbers between 0 and $2^B-1$.

That is, stress data P may be converted (e.g., divided or quantized) into quantized data Q, such as dividing by S before adding to the accumulation. It should be noted that the particular technique of quantization may vary between embodiments and is not limited to the above-described technique. For example, in other embodiments, division by the scale factor S may take place immediately (and not when the accumulations are approaching their limit).

Without further processing of the stress data 5, this division may introduce quantization error (e.g., loss of accuracy, which may become quite significant with larger values of S), as is known to one of ordinary skill. For example, if the (current) scale factor S is 4, then the next pixel stress data P may be converted to a multiple of 4 by zeroing out the low order two bits (in the binary representation of P) and shifting the resulting number. This, however, may introduce quantization error, particularly if the stress data P is nonrandom (such as being the same or similar values much of the time).

For instance, stress values of 3 are indistinguishable from stress values of 0 in the above scenario, since both are quantized to 0. Accordingly, if there are a large number of 3's in the stress data for a particular pixel, it will appear as if there is no stress at all. Similarly, if there are a large number of 4's for another pixel, the two pixels will appear to be undergoing significantly different stress even though their respective stress data are as close as possible (3 and 4) without being the same. This is an example of further quantization error. In addition, the quantization error may intensify with larger scale factors S (as more and more accuracy is reduced to permit larger accumulations to fit in the same amount of space (e.g., same number of bits).

According to embodiments of the present invention, a specially selected set of temporal dithering offsets is maintained while each data entry is accumulated. For example, by choosing a sufficient large scale factor S (or quantization divisor), the accumulative data may be maintained within M bits without risk of overflow. For ease of description, S may be assumed to be a power of two, with M bits being the available storage for the accumulation and each stress data being D bits (for example, D=8) in size.

Given the memory size of M bits to store the accumulation, and D data bits of each stress data, there are only M−D bits available for accumulation. Further, if there is a need to accumulate $2^A$ such data values, the quantization divisor S may be chosen to be $2^{A-(M-D)}=2^{A-M+D}$ (or greater). The temporal dithering may then be achieved by using dynamically changed offsets F that take on values between 0 and S−1. Given a pixel stress value P of D bits, the quantization of P may take on the form Q=(P+F)/S, where Q represents the quantized value of the pixel data P, and the division may be unsigned integer division with truncation. The quantized stress value Q then represents a truncated value that is accumulated in the M bits, while the temporal dithering offsets F cycle through the numbers 0, 1, . . . , S−1 (that is, the offsets F are a permutation of these S numbers) in a pseudorandom fashion.

For example, one technique to produce this permutation of temporal dithering offsets F is to take an increment I relatively prime to the scaling factor S (that is, I is odd when S is a power of two), and incrementing the temporal dithering offset F by I each time the offset F is used. This addition may be modulo S to keep the offset F between 0 and S−1. That is, if F+I exceeds S−1, then the new offset is set to F+I−S. Accordingly, there are S temporal dithering offsets F between 0 and S−1 used cyclically to generate the quantized stress values Q, with any consecutive S offsets F including every integer between 0 and S−1.

In addition, to make the temporal dithering offsets F appear to be random (which helps lessen quantization error on localized patterns of stress data), I may be chosen to maximize or increase the likelihood that the sum of any three consecutive offsets F is between S and 2×S. For example, I may be chosen between (and not too close to) S/2 and (2*S)/3, or between (and not too close to) (2*S)/3 and (3*S)/4, which helps keep the offsets distributed and not in localized short patterns that have similar numbers every two, three, or four consecutive offsets.

Figure 2:
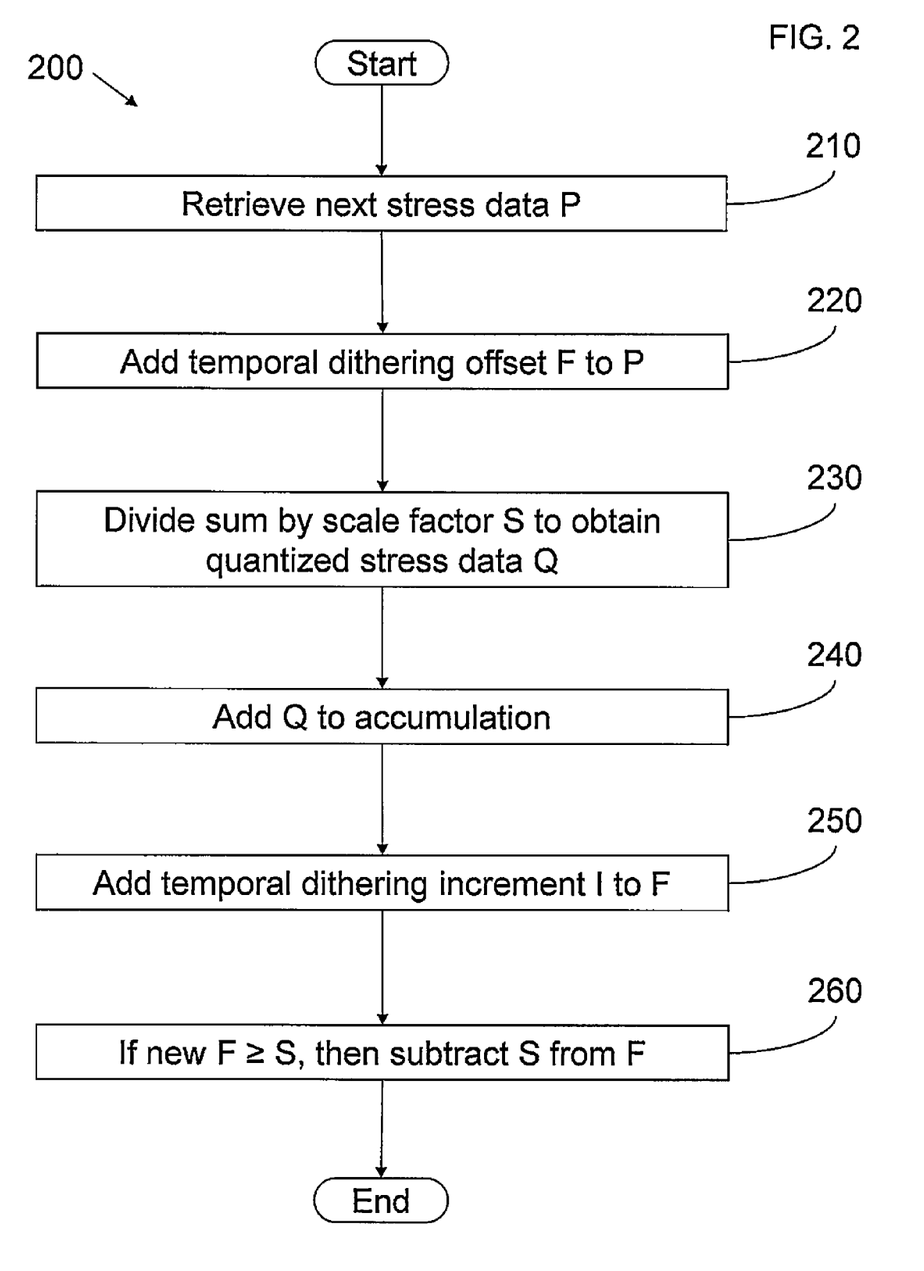
FIG. 2 is a flowchart of an example method of accumulating stress data according to an embodiment of the present invention.

FIG. 2 is a flowchart of an example method 200 of accumulating stress data according to an embodiment of the present invention. This and other described methods in the present application may be performed, for example, by a computer processor executing computer instructions that perform the described methods, as would be apparent to one of ordinary skill. Further, in this and other described methods of the present invention, the appearance or ordering of the steps is not necessarily limited to that which is described, and in other embodiments, the appearance or ordering of the steps may be altered to achieve the same or similar result, as would be apparent to one of ordinary skill.

Embodiments of the present invention are directed to reducing or minimizing this quantization error, to preserve as much accuracy as possible in the face of limited accumulation storage. According to one or more embodiments, a dithering offset F is used to reduce or minimize the quantization error. Quantization may be obtained by dividing the sum of the next pixel (stress) data P and the dithering offset F by the scale factor S (e.g., a power of two, which reduces division of unsigned fixed point numbers to a more simpler shift operation) to produce quantized stress data Q.

However, by adding the dithering offset F to the stress data P prior to the division by the scale factor S, the quantization error may be reduced or minimized. For example, in the above scenario, if F=1, then stress values of 3 are rounded up to 4 while stress values of 0 remain 0. The dithering offset F should vary, though, with different stress data P for the same pixel (that is, be a temporal dithering offset, with different values at different times), or the quantization error will remain, only be more noticeable on different values (or sets of values) of stress data P. If the dithering offset F varies, such as between values of 0 and 3 in the above scenario, then the quantization error should be reduced or minimized.

The varying of the temporal dithering offsets F does not have to take place with every use of F. For example, in an OLED display device accumulating stress data for each pixel each frame, the same temporal dithering offset F may be used for all of the pixels for a given frame, and then changed to a new value for processing the next frame. That is, the same offset F may be used only once per accumulation before being changed, but does not have to be changed between different accumulations.

This varying should also be somewhat random (e.g., pseudorandom), which helps prevent patterns in the stress data P from lining up with patterns in the temporal dithering offsets F. This phenomenon may also lead to quantization error (for example, if the stress data P increments in the same pattern as the temporal dithering offsets F decrement, that will cause quantization error). Accordingly, the temporal dithering offsets F may be chosen in a pseudorandom fashion to take on values between 0 and S−1.

For example, the temporal dithering offset F may be incremented by an increment between 0 and S−1, where I is relatively prime to S, and the resulting sum reduced by S if needed to keep the temporal dithering offset F between 0 and S−1. Because I and S are relatively prime, this process will generate every number between 0 and S−1 in a fixed pattern of S numbers. Further, if I is selected large enough and not too close to any simple fraction of S (e.g., not near 5, S/2, S/3, 2×S/3, etc.), the pattern generated by this technique will have the appearance of randomness.

To summarize, the offset F is added to the stress data P and the sum is divided by S. The resulting quotient is then the quantized stress data Q, which is then added to the corresponding accumulation (and without risk of overflowing the size of the accumulation). This is illustrated in method 200 of FIG. 2. Processing begins, and in step 210, the next stress value P (such as a pixel stress value) is obtained. In step 220, the temporal dithering offset F is added to P. In step 230, this sum is divided by the scale factor S to obtain the quantized stress data Q. In step 240, this quantized stress data Q is added to the accumulation. In step 250, the temporal dithering increment I is added to the temporal dithering offset F. In step 260, if the resulting sum (next temporal dithering offset F) is greater than or equal to the scaling factor S, then the scaling factor S is subtracted from the offset F to keep the next temporal dithering offset F between 0 and S−1.

In addition to being relatively prime to the scaling factor S, the temporal dithering increment I should be chosen to create a pseudorandom effect to the temporal dithering offsets. That is, I−1 or S−1 are not appropriate choices for the temporal dithering increment I, as they produce very predictable temporal dithering offsets. For example, setting I between S/3 and 2×S/3 (and not close to S/2) permits very short sequences of corresponding temporal dithering offsets to take on values that are not close to each other. This effect can be further enhanced by selecting values of I that are not close to simple divisors or fractions of S (such as S/2, S/3, and S/4). For example, I may be the closest number to $2\times S/(1+\sqrt{5})$ (i.e., S divided by the golden ratio, which is approximately 1.618) that is relatively prime to S. For instance, if S=1024, then may be 633. As a goal, I may be chosen to increase or maximize the likelihood that any three corresponding consecutive temporal dithering offsets F add up to between S and 2×S.

Figure 3:
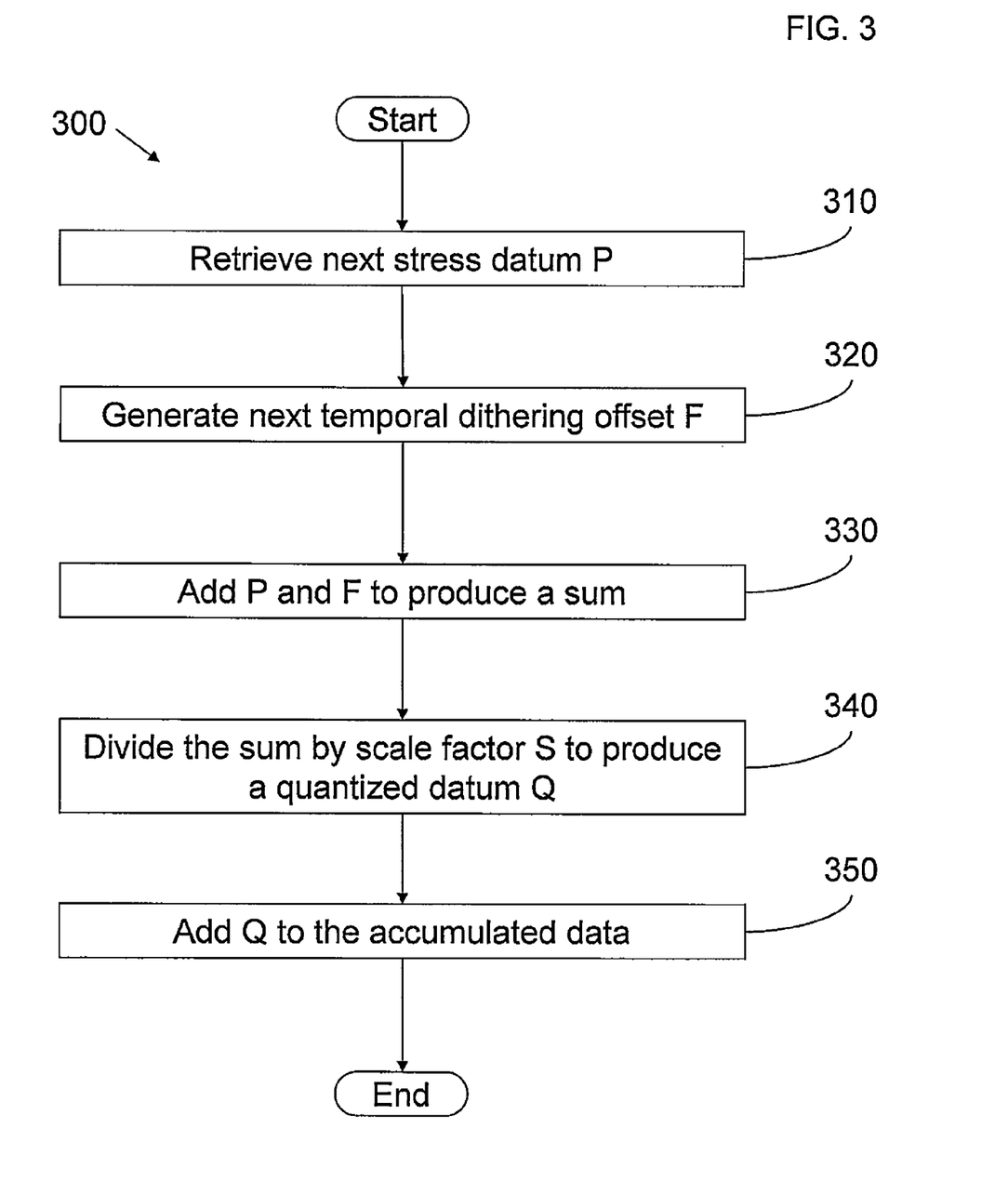
FIG. 3 is a flowchart of an example method of accumulating stress data according to another embodiment of the present invention.

FIG. 3 is a flowchart of an example method 300 of accumulating stress data according to another embodiment of the present invention. For example, the method 300 may be used to accumulate data (such as stress data or other data indicative of use) in a nonvolatile memory to track the use of a device (such as pixels of a display device). The method may be performed by a computer processor, such as a microprocessor that is integral to the device.

Processing begins, and in step 310, the next stress datum P is retrieved. P may represent, for example, a use of the device for a recent moment in time, such as a current pixel stress value (for instance, P may be a next image datum for a pixel of a display device, or the next image datum converted into the stress datum P by mapping the next image datum to a corresponding stress datum that reflects the corresponding stress on the pixel when driven with the image datum). In step 320, the next dithering offset F (in a set of temporal dithering offsets) is generated (for example, as described above). In step 330, the stress datum P is added to the dithering offset F to produce a sum. In step 340, this sum is divided by a scale factor S to produce a quantized datum Q. In step 350, the quantized datum Q is added to the accumulated data. Here, the accumulated data may track the use of the device.

Accordingly, embodiments of the present invention reduce total memory size for accumulated data by summing the quantized data instead of summing the original data. Further, by designing the temporal dithering offsets F to be selected from (potentially large) relatively prime numbers I and S (increment and scaling factor, respectively), the quantization divisor S (scaling factor) may be much larger than the data's maximum value. In addition, further data may be accumulated beyond the planned $2^{-A}$ data values P in each accumulation by growing the scaling factor S by an appropriate amount (e.g., multiplying S by four to accommodate four times as many data values P in the same amount of space), dividing the existing accumulations accordingly by this increase, and selecting a new increment I to use with the increased quantization divisor S.

Temporal Weighting

In real life applications, the importance of the accumulated data may not always be equal in time (e.g., each data value being equally weighted in the accumulative data). Instead of changing the sampling frequency to adjust the weighting (e.g., sampling more frequently to increase the weight of the corresponding samples), which may be very complex in design, the same goal may be achieved more simply by having a temporal weighting curve, such as a preloaded temporal weighting curve. For example, by adjusting the divisor S and recalibrating accumulated data values in the memory, further accuracy and better fit for real usage can be achieved.

The above-described embodiments use uniform weighting (that is, every data value being weighted equally with every other data value in the same accumulation). One technique to give more weight to recent samples is to define some (small) weighting factor $\alpha$. Then, if T represents the running total (accumulation) of the different quantized data values, the next quantized stress value Q may be accumulated into this total T by setting the new T to $[(1-\alpha)\times T]+Q$. This temporal weighting may also eliminate the need for or the benefit from dithering, depending on factors such as the value of $\alpha$.

In general, both of the parameters S (scaling factor) and K (number of samples) may be adjusted or updated to produce different temporal weighting effects. For example, the average data value of the previous K data values is approximated by the number T×S/K, where T represents the accumulated total. This implies equal weight to each data value. If it is desired to more heavily weight the current or recent data, the number of the accumulated data collected may be reduced by replacing K with a smaller number while decreasing the total T proportionally (to maintain the same average for the existing accumulated data). If, on the other hand, it is desired to more heavily weight the previous or earlier data, the number of the accumulated data collected may be increased by replacing K with a larger number while increasing the total T proportionally (to maintain the same average for the existing accumulated data).

Similarly, to not waste unused bits, at the beginning of the accumulating, a small scaling factor S may be selected for high accuracy and then changed (increased) later as the accumulation bits are consumed. For example, the scaling factor S may be increased to a larger number while keeping the parameter K unchanged by decreasing the accumulative data T from by the same proportion of the increase to S.

Further, by maintaining the scaling factors S as powers of two, the associated calculations of this conversion may be simple on a computer processor. In addition, to help prevent offset inaccuracy, the parameter S may be only allowed to change after the completion of one full divisor cycle (e.g., after all values between 0 and S−1 have been generated) for the previous value of S.

Experimental Results

Figure 4:
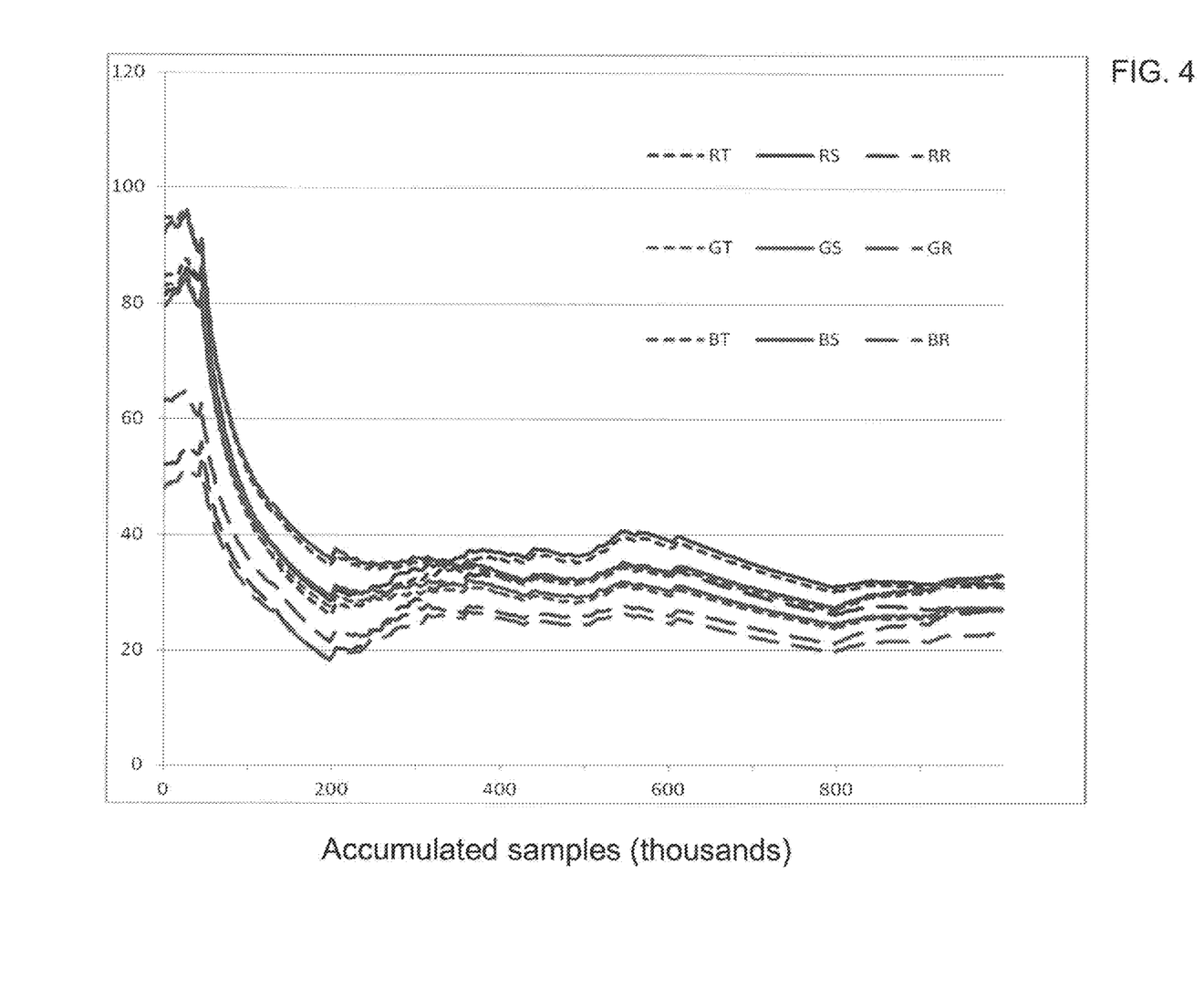
FIG. 4 is a color graph showing experimental results of average stress values accumulated over a number of samples for each of red, green, and blue pixels of a display device for both an embodiment of the present invention and a comparable embodiment.

FIG. 4 is a color graph showing experimental results of average stress values accumulated over a number of samples for each of red, green, and blue pixels of a display device for both an embodiment of the present invention and a comparable embodiment. In FIG. 4, the horizontal (x-) axis represents accumulated samples in thousands while the vertical (y-) axis represents the accumulated average stress value of the accumulated samples for each particular color pixel.

In FIG. 4, the red lines represent the experimental results for the red pixels, the green lines represent the experimental results for the green pixels, and the blue lines represent the experimental results for the blue pixels. In addition, the small dashed lines (RT, GT, and BT) represent the actual (precise) averages of the accumulated stress values (as if sufficient memory were always available to track the averages, for red, green, and blue pixels, respectively), the solid lines (RS, GS, and BS) represent the averages as maintained by an embodiment of the present invention (for red, green, and blue pixels, respectively), and the large dashed lines (RR, GR, and BR) represent the averages as maintained by a comparable embodiment (for red, green, and blue pixels, respectively).

To produce the data shown in FIG. 4, 1,000,000 pixel samples of OLED stress data (pixel values) were processed. Here, 8-bit pixel stress data (i.e., D=8) was used, with 1,000,000 samples (i.e., K=1,000,000≅$2^{20}$=$2^4$), for a memory size of 18 bits (i.e., M=18) per accumulation (in the embodiment according to the present invention and in the comparable embodiment). In addition, in the comparable embodiment, quantization was set to 4 bits and sampling set to once every $2^6$=64 samples (to contain the size of the accumulations to 18 bits), this combination of quantization and sampling rate producing the best performance of any of the comparable embodiments.

As can be seen in FIG. 4, the embodiment according to the present invention produced accumulated stress data averages almost identical to (and slightly higher than) that of the precisely calculated average stress values, while the comparable embodiment produced accumulated stress data averages considerably lower than the actual average stress values.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof

What is claimed is:

1. A method of accumulating data by a processor in a nonvolatile memory to track use of a device, the method comprising:
retrieving by the processor a next datum for accumulation into a first accumulation stored in the memory, the next datum representing a next use of the device;
generating by the processor a next dither offset;
adding by the processor the next dither offset to the next datum to produce a first sum;
dividing by the processor the first sum by a scale factor to produce a quantized datum; and
adding by the processor the quantized datum to the first accumulation,
wherein the first accumulation tracks the use of the device.

2. The method of claim 1, wherein the generating of the next dither offset comprises adding a dither increment to a previous dither offset.

3. The method of claim 2, wherein the dither increment is relatively prime to the scale factor.

4. The method of claim 3, wherein the dither increment is between two-thirds and three-fourths of the scale factor.

5. The method of claim 1, wherein the scale factor is a power of two.

6. The method of claim 1, further comprising increasing the scale factor over time.

7. The method of claim 6, wherein the increasing of the scale factor comprises decreasing the first accumulation by a corresponding ratio.

8. A system for accumulating data to track use of a device, the system comprising:
a nonvolatile memory for storing the accumulated data; and
a processor configured to:
retrieve a next datum for accumulation into a first accumulation stored in the memory, the next datum representing a next use of the device;
generate a next dither offset;
add the next dither offset to the next datum to produce a first sum;
divide the first sum by a scale factor to produce a quantized datum; and
add the quantized datum to the first accumulation,
wherein the first accumulation tracks the use of the device.

9. The system of claim 8, wherein the processor is further configured to generate the next dither offset by adding a dither increment to a previous dither offset.

10. The system of claim 9, wherein the dither increment is relatively prime to the scale factor.

11. The system of claim 10, wherein the dither increment is between two-thirds and three-fourths of the scale factor.

12. The system of claim 8, wherein the scale factor is a power of two.

13. The system of claim 8, wherein the processor is further configured to increase the scale factor over time.

14. The system of claim 13, wherein the increasing of the scale factor comprises decreasing the first accumulation by a corresponding ratio.

15. A display device comprising:
pixels for displaying an image using corresponding image data;
a nonvolatile memory for storing accumulated stress data, the stress data corresponding to the image data;
a processor configured to:
retrieve a next stress datum of the stress data to accumulate into a first accumulation stored in the memory;
generate a next dither offset;
add the next dither offset to the next stress datum to produce a first sum;
divide the first sum by a scale factor to produce a quantized datum; and
add the quantized datum to the first accumulation,
wherein the first accumulation tracks a use of one or more corresponding ones of the pixels.

16. The display device of claim 15, wherein the processor is further configured to generate the next dither offset by adding a dither increment to a previous dither offset.

17. The display device of claim 16, wherein the dither increment is relatively prime to the scale factor.

18. The display device of claim 17, wherein the dither increment is between two-thirds and three-fourths of the scale factor.

19. The display device of claim 15, wherein the scale factor is a power of two.

20. The display device of claim 15, wherein the processor is further configured to increase the scale factor over time.

* * * * *